(12) United States Patent
Rapoport

(10) Patent No.: US 6,670,877 B2
(45) Date of Patent: Dec. 30, 2003

(54) FIELD ADJUSTING MECHANISMS AND METHODS FOR PERMANENT MAGNET ARRANGEMENT WITH BACKPLATE

(76) Inventor: Uri Rapoport, Meshek 17, Moshav Ben-Shemen (IL), 73115

( * ) Notice: Subject to any disclaimer, the term of this patent is extended or adjusted under 35 U.S.C. 154(b) by 0 days.

(21) Appl. No.: 09/769,779

(22) Filed: Jan. 25, 2001

(65) Prior Publication Data

US 2002/0097122 A1 Jul. 25, 2002

(51) Int. Cl.[7] .............................. G01R 33/20; H01F 7/02
(52) U.S. Cl. ...................... 335/296; 335/297; 335/298; 335/301; 324/320
(58) Field of Search ....................... 335/216, 296–306; 324/318, 319, 320

(56) References Cited

U.S. PATENT DOCUMENTS

| | | | | |
|---|---|---|---|---|
| 5,431,165 A | * | 7/1995 | Sellers | 324/318 |
| 5,900,793 A | * | 5/1999 | Katznelson et al. | 335/296 |
| 6,147,578 A | * | 11/2000 | Panfil et al. | 324/319 |

* cited by examiner

*Primary Examiner*—Ramon M. Barrera
(74) *Attorney, Agent, or Firm*—Jerry A. Schulman

(57) ABSTRACT

Apparatus and methods for the adjustment of a magnetic field produced by permanent magnet arrangements facing each other across an air gap include a series of ferromagnetic shim blocks individually adjustably positionable within the magnet arrangements to adjust the strength and uniformity of the magnetic field. A backing plate to which the permanent magnets are attached has channels within which adjusting elements are used to move the shim blocks with relation to the permanent magnets, preferably toward or away from the air gap. Shim blocks are arranged in selected geometric arrays and shapes responsive to the geometry of the magnet arrangements and may be formed as toroidal shapes or as individual blocks of varying sizes.

5 Claims, 8 Drawing Sheets

FIELD ADJUSTING MECHANISMS AND METHODS FOR PERMANENT MAGNET ARRANGEMENT WITH BACKPLATE

FIELD OF THE INVENTION

The present invention relates generally to permanent magnet arrangements for equipment used to conduct magnetic resonance imaging (MRI) examinations and, in particular, to a magnet arrangement which uses a backplate to increase magnetic field strength and a field adjusting apparatus built into the backplate which allows magnetically permeable shim blocks within the backplate to be individually adjusted to strengthen and align the magnetic field. This application claims priority from U.S. patent application serial No. 60/177,958 filed Jan. 25, 2000 and entitled "Field Adjusting Mechanisms and Methods For Permanent Magnet Arrangement With Backplate".

BACKGROUND OF THE INVENTION

Apparatus used for MRI diagnostic procedures require the use of large magnets to create the strong, uniform magnetic field required for accurate test results. An MRI unit must be of a size and configuration to enable a patient to place all or a substantial part of his or her body into that portion of the magnetic field found to be the strongest and most uniform.

A typical MRI apparatus features an opposed pair of magnet groupings supported by a generally C-shaped frame designed to hold the groupings in face-to-face parallel configuration. An air gap or space is defined between the magnet groupings where the patient is positioned. Each of the frame legs and cross members is made from a highly permeable ferromagnetic material to complete a circuit for the magnetic flux to travel from one magnet grouping across the air gap to the remaining grouping.

Because the magnet groupings are quite heavy, it is necessary to construct the frame of sufficiently massive members to limit deflection of the frame not only by the weight of the magnets but the weight combined with the attractive force the magnet groupings exert on each other. The weight of the magnet groupings and the massiveness of the frames needed to support them can make MRI units costly and difficult to construct and inconvenient to move.

MRI units and the magnet groupings used in them are well represented in the prior art.

U.S. Pat. No. 5,623,241 (Minkoff) teaches and describes a permanent magnetic structure comprising a C-shaped frame which supports two opposed magnet groupings at the open end of the frame legs, thereby forming an air gap. The groupings in Minkoff are single-piece, permanent magnets arranged in parallel, face-to-face relationship, each magnet having a pole piece positioned on its outer face.

U.S. Pat. Nos. 4,943,774 and 5,134,374 (Breneman, et al.) teach and describe various magnetic field control apparatus. Both patents feature magnet groupings consisting of a permanent magnetic pole supported on a rear frame and having a pole face formed from ferrous material. Breneman, et al '774 utilizes a number of ferrous segments positioned on an annular member attached to one pole face, with the segments being radially repositionable to adjust the magnetic field strength and orientation. Breneman, et al '374 uses a series of segments applied directly to the pole faces to adjust the magnetic field.

U.S. Pat. No. 5,194,810 (Breneman, et al.) teaches and describes a superconducting MRI magnet with magnetic flux field homogeneity control which uses radially positioned circular segments as shims to adjust the magnetic field created between two magnet groupings.

U.S. Pat. No. 5,332,971 (Aubert) teaches and describes a permanent magnet for nuclear magnetic resonance imaging equipment utilizing a number of magnetic blocks arranged into concentric rings to produce a homogeneous magnetic field.

U.S. Pat. No. 5,659,250 (Domigan, et al.) teaches and describes a fill brick construction of magnet assembly having a central bore in which a plurality of individually magnetized bricks are arranged in elliptically shaped sections to create a bore within which a patient can be placed for MRI examination. The individual bricks are formed as parallelepiped and the field is adjusted by the shapes of the groupings of bricks used.

U.S. Pat. No. 4,998,084 (Alff) teaches and describes a multipolar magnetic ring consisting of two rings having magnetic segments formed about their inner peripheries which interengage to form a single ring.

U.S. Pat. No. 4,734,253 (Sato, et al.) teaches and describes a method for the preparation of sintered magnets from Fe-B rare earth alloy with the sintered magnetic segments arranged to form a circular ring.

U.S. Pat. No. 4,538,130 (Gluckenstern, et al.) teaches and describes a tunable segmented ring magnet and method of manufacture whereby a circular ring of permanent magnetic segments is formed for use in NMR imaging systems.

U.S. Pat. No. 4,093,912 (Double, et al.) teaches and describes an NMR magnet assembly with pole face parallelism adjustment used to align the faces of magnetic pole pieces used in NMR magnet arrangements.

U.S. Pat. No. 5,028,903 (Aubert) teaches and describes a spherical permanent magnet with equatorial access consisting of a pair of hemispherical magnet arrangements creating therewithin an air gap for use in MRI procedures.

My co-pending U.S. patent application Ser. No. 09/388,836 teaches and describes a C-shaped MRI magnet arrangement with individual magnet elements which are separately moveable with respect to one another to adjust the field strength and uniformity of the magnetic field formed in the closed-loop apparatus.

U.S. Pat. No. 5,900,793 (Katznelson) teaches and describes a single magnet grouping intended for use in non-closed loop apparatus, having at least one magnet grouping which has toroidal magnets individually adjustable with respect to each other while preserving an opening through the magnet groupings to allow access to a patient positioned near the grouping.

It is an object of the present invention to provide a permanent magnet arrangement for use in MRI equipment in which the strength of the magnetic field created by the magnets used in the arrangement is increased without significantly increasing the weight of the arrangement.

It is a further object of the present invention to provide a field-strengthening arrangement adaptable to a wide variety of shim arrangements.

Yet another object of the present invention is to provide embodiments of the present invention that are inexpensive to construct and maintain.

An additional object of the present invention is to provide such magnetic field enhancements which take full advantage of the adjustability of the resulting magnetic field with simple mechanical expedients which do not involve moving the magnets themselves.

BRIEF DESCRIPTION OF THE INVENTION

A permanent magnet arrangement adapted for use in MRI examinations has a generally C-shaped yoke formed from a magnetically conductive material such as soft steel. A pair of permanent magnet groupings is positioned at and joined to the open ends of the C-shaped yoke in parallel, spaced relationship to create an air gap therebetween within which a test subject is positioned to undergo MRI examination. In a preferred embodiment, each magnet arrangement consists of a disk-shaped magnet. Each magnet is attached to a backplate which, in turn, is attached to the C-shaped yoke. An adjusting mechanism formed as part of the backplate allows the magnetic field strength and uniformity to be adjusted to form a magnetically-conductive path between the magnets across the air gap and, thereby, through the yoke.

While the following describes a preferred embodiment or embodiments of the present invention, it is to be understood that this description is made by way of example only and is not intended to limit the scope of the present invention. It is expected that alterations and further modifications, as well as other and further applications of the principles of the present invention will occur to others skilled in the art to which the invention relates and, while differing from the foregoing, remain within the spirit and scope of the present invention as herein described and claimed.

These and further objects of the present invention will become more apparent upon consideration of the accompanying drawings wherein:

DETAILED DESCRIPTION OF THE DRAWINGS

Figure 1:
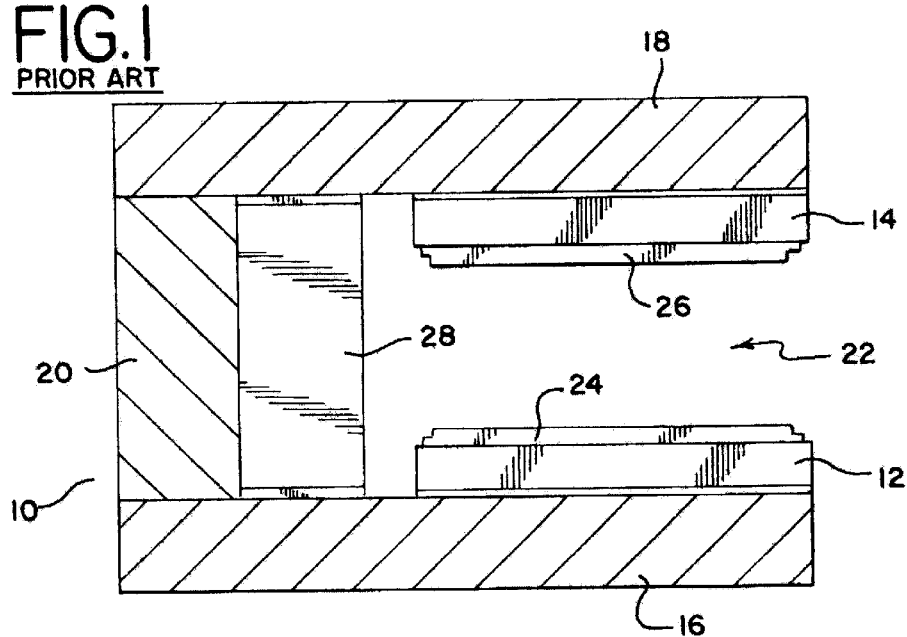
FIG. 1 is a schematic view of a first prior art C-shaped permanent magnet MRI device having no field adjusting mechanism.

Referring now to FIG. 1, the numeral 10 indicates generally a prior art C-shaped permanent magnet arrangement intended for use in connection with MRI equipment. A pair of permanent magnets 12, 14 are held in a generally U-shaped structure which includes a pair of support arms 16, 18 to which magnets 12, 14 are attached and which are joined by a cross piece 20. Support arms 16, 18 and cross piece 20 define a "yoke" configuration and are preferably manufactured from highly permeable ferromagnetic material to create a magnetic circuit defined by magnet 12, arm 16, cross piece 20, arm 18, magnet 14 and an air gap 22 within which an article to be examined using MRI is placed.

In the prior art example shown, magnet 12 has a pole piece 24 positioned substantially coextensive with the face of magnet 12, while magnet 14 has a similar pole piece 26 positioned substantially coextensive with the face of magnet 14.

It is a teaching of the prior art that arms 16 and 18 be of sufficient length such that cross piece 20 does not introduce undesirable variations in the uniformity of the magnetic field extending across air gap 22. In the example shown, a reinforcing support 28 is also provided to hold arms 16 and 18 as close to parallel as possible, thereby making the faces of pole pieces 24 and 26 as close to parallel as possible. Any "sag" or other movement of one support arm toward the other whether through the action of gravity or magnetic attraction affects the uniformity of the magnetic field making MRI less precise.

Figure 2:
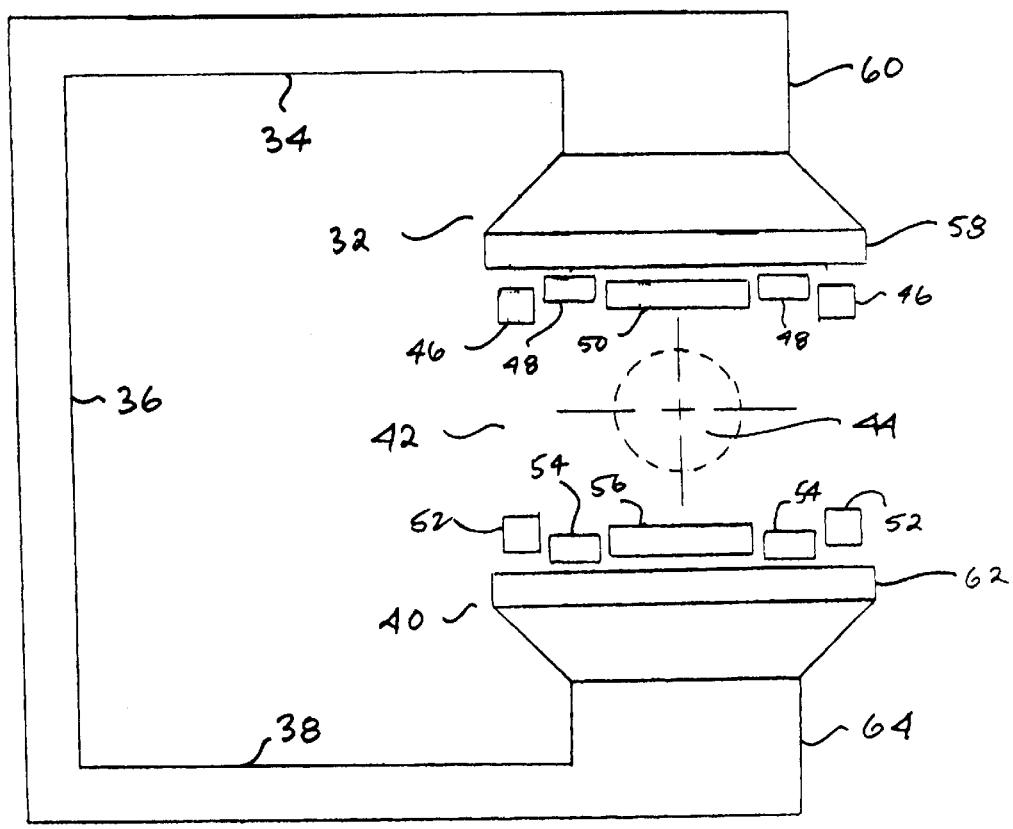
FIG. 2 is a schematic view of a second C-shaped permanent magnet MRI device showing the use of magnet assemblies with individually adjustable ring magnets attached to backplates.

Referring to FIG. 2, a second C-shaped MRI device is shown schematically. As with the structure of FIG. 1, the magnet assembly 30 is generally C-shaped having a first magnet arrangement 32, a first cross arm 34, a support arm 36, a second support arm 38, and a second magnet arrangement 40, all arranged to create an air gap 42 within which an MRI test zone 44 is created.

As shown in FIG. 2, magnet arrangement 32 is preferably formed from a series of circular concentric magnets. In the example shown, arrangement 32 has an outer magnet 46, a middle magnet 48 and a central magnet 50. Magnet arrangement 40 consists of elements identical to those in arrangement 32, namely, an outer ring-shaped magnet 52, a middle ring-shaped magnet 54 and a central magnet 56.

FIG. 2 also shows the use of a steel backplate 58 joined to support block 60 of yoke arm 34. In similar fashion, an identically shaped backplate 62 is attached to support end 64 of yoke arm 38.

It has been found that including backplates 58 and 62 in magnet arrangements 32 and 40, respectively, results in a strengthening of the magnetic field created across air gap 44 without requiring the use of such expedients as electrically powered auxiliary magnets or shim coils. For magnets with a given strength, the use of backplates 58 and 62 increases field uniformity and resolution yielding more sensitive and detailed MRI results.

Figure 3:
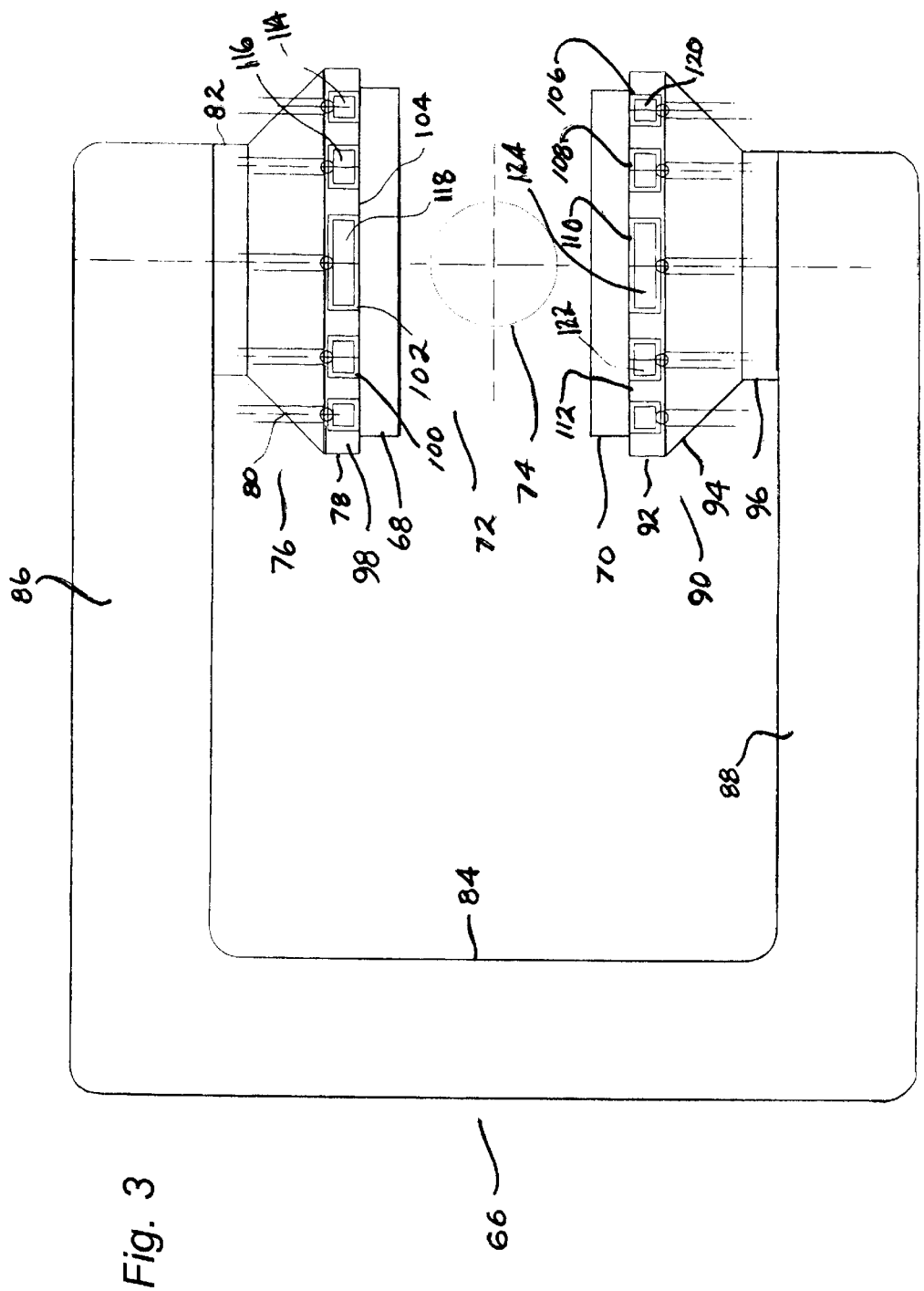
FIG. 3 is schematic view of a C-shaped permanent magnet MRI device constructed in accordance with a preferred embodiment of the present invention.

Referring now to FIG. 3 there is shown a preferred embodiment of the present invention. A pair of one-piece permanent magnets is positioned on either side of an air gap. Each magnet is attached to a corresponding backplate and an adjusting mechanism for "fine tuning" the magnetic field strength and uniformity is built as an integral part of each backplate.

In a first preferred embodiment of the present invention, an adjusting mechanism comprises a series of concentric circular channels formed in the face of the backplate. A shim made from a ferromagnetic material such as soft steel is positioned within the channel. In a first version, each shim is formed as a toroidal ring to fit within its corresponding channel. In this version the magnets are circular and the shims are toroidal. A series of adjusting screws are threaded through the back of the backplate into each channel and are journalled to the shims. Each screw may be used to position one of the shims within the channel: by turning the screws, moving the shims either toward or away from the magnet.

Referring now to FIG. 3, numeral 66 indicates generally a C-shaped MRI diagnostic device generally configured as described hereinabove, with a first permanent magnet 68 and a second permanent magnet 70 are arranged in face-to-face relationship to define an air gap 72 between them. Preferably, a diagnostic zone 74 is selected within air gap 72 within which the actual MRI examination and analysis will be performed. It is a goal of the present invention to have the magnetic field within diagnostic zone 74 be as strong and uniform as possible to produce the best diagnostic results.

Permanent magnet 68 is attached to a backplate 76 which in FIG. 3 will be referred to as upper backplate 76. In the embodiment shown, upper backplate 76 is a lower cylindrical section 78 a frustoconical section 80 and a second upper cylindrical section 82. Backplate 76 is attached to yoke 84 at upper yoke arm 86 at upper cylindrical section 82.

An identical arrangement is attached to lower yoke arm 88. As shown in FIG. 3, lower backplate 90 has a lower cylindrical section 92 corresponding to cylindrical section 78, a frustoconical intermediate section 94 corresponding to frustoconical section 80 and an upper cylindrical section 96 corresponding to upper section 82 with upper cylindrical section 96 being attached to lower yoke arm 88.

In the embodiment shown in FIG. 3, it is to be understood that although magnets 68 and 70 have been characterized as disk-shaped permanent magnets, such magnets are commonly manufactured from individual magnet segments which are assembled to form the fixed permanent magnet. In like fashion, each backplate 76, 90 may also be formed from a series of individual segments which are assembled in the final backplate configuration.

Referring again to FIG. 3, upper backplate 76 has an outer groove 98, an intermediate shim groove 100 and a central shim cavity 102 formed in the face 104 of backplate 76.

In like fashion, backplate 90 has outer shim groove 106, intermediate shim groove 108 and central shim cavity 110 formed in lower backplate face 112.

For the purpose of the embodiment shown herein, outer grooves 98, 106 and intermediate grooves 100, 108 are rectangular in cross section and are formed as circles in backplate faces 102, 112. Central shim cavities 102, 110 are formed as right cylindrical sections in faces 102, 112.

A series of shim blocks are shown in FIG. 3 with outer shim block 114 positioned within outer shim groove 98, intermediate shim block 116 positioned within intermediate ship groove 100 and central shim disk 118 positioned within central shim cavity 102. In like fashion, lower backplate 90 has an outer shim block 120 positioned within outer shim groove 106, an intermediate shim block 122 positioned within intermediate shim groove 108 and a central shim disk 124 positioned within central shim cavity 110.

Figure 4:
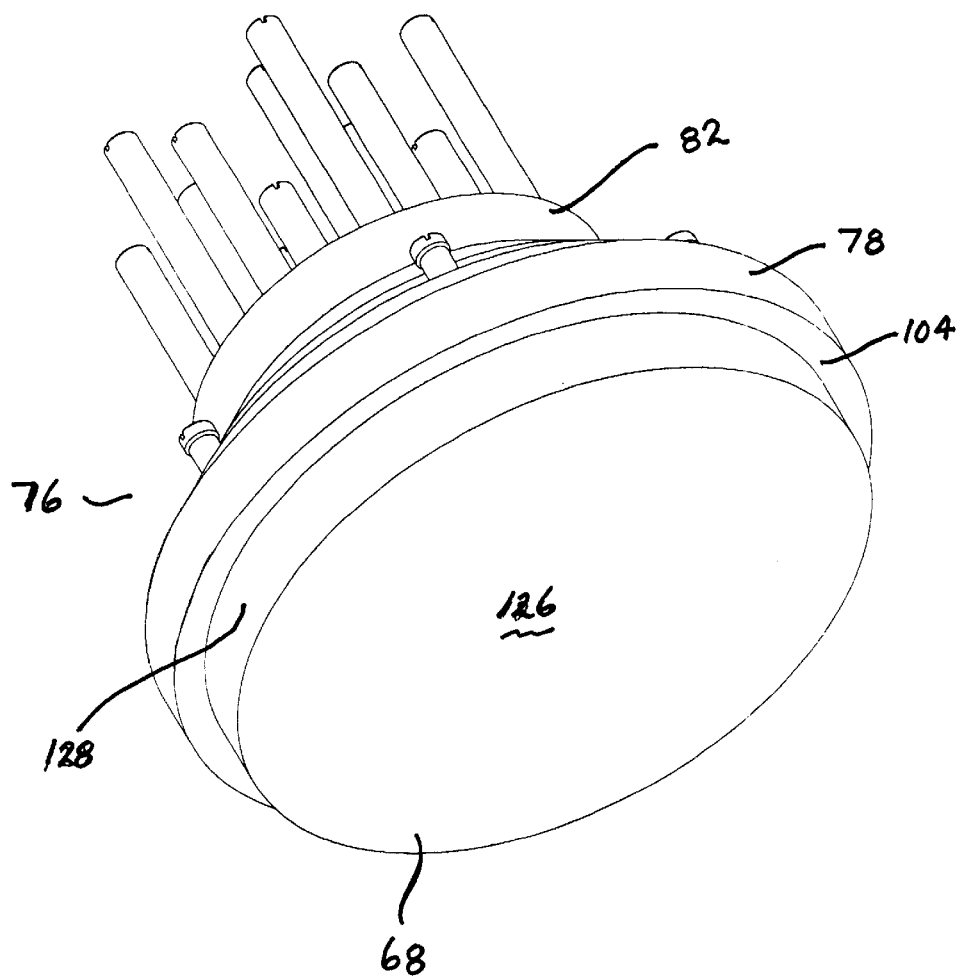
FIG. 4 is first perspective view of an individual magnet assembly of FIG. 3 showing the permanent magnet and the backplate removed from the yoke.

A series of adjusting shafts is shown in FIG. 3 with said shafts positioned at backplates 76 and 90 in a manner to be more filly described hereinbelow. Referring to FIG. 4, a perspective view of one of the backplate assemblies is shown with said assembly being detached from yoke 66. For purposes of consistency, the backplate assembly shown in FIGS. 4, 5 and 6 will be referred to as the upper backplate 76 with all of the components thereof being identified by identical numerals to those used in FIG. 3.

Figure 5:
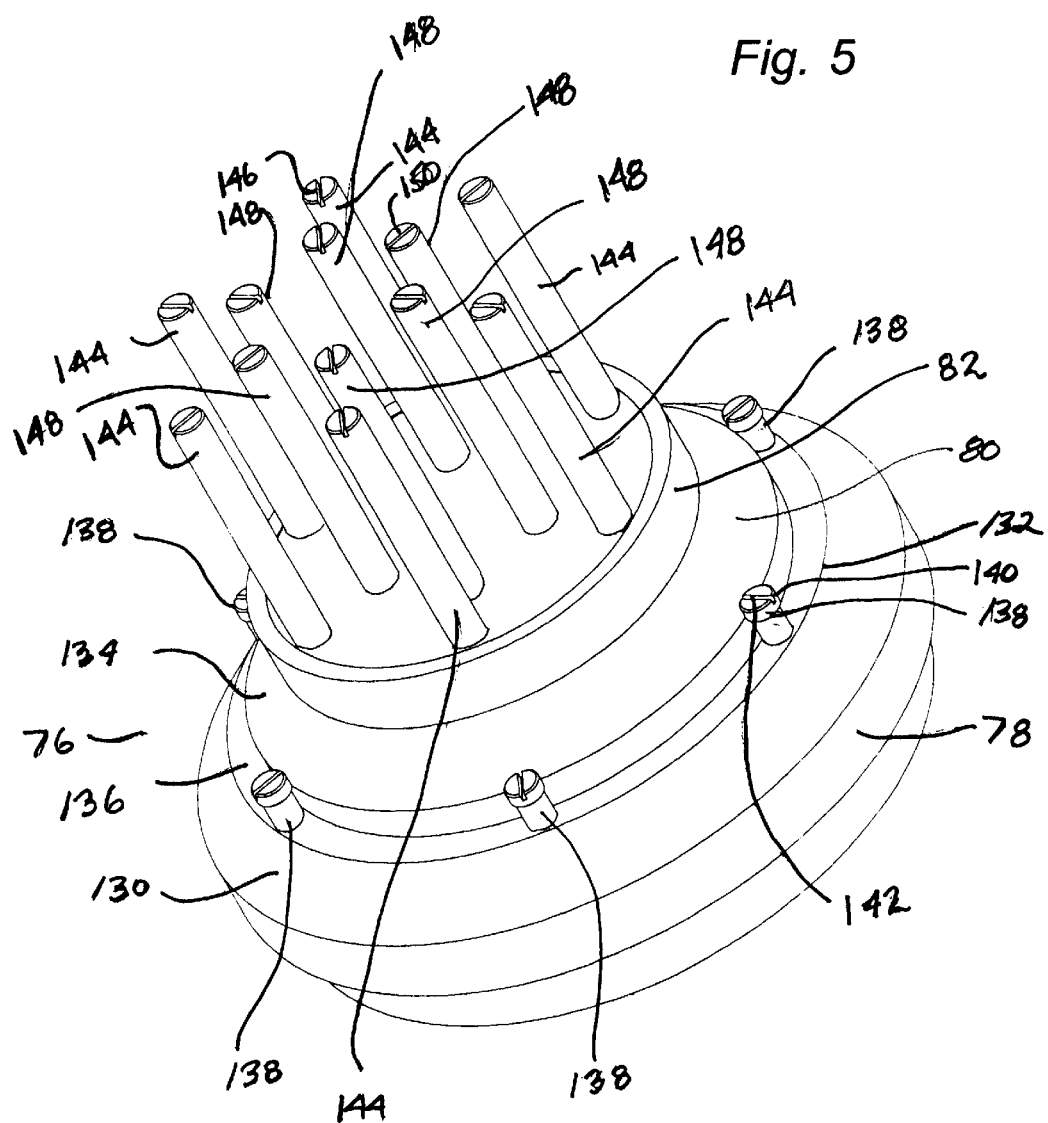
FIG. 5 is a second perspective view of the assembly of FIG. 4.

In FIG. 4, magnet 68 is shown in the preferred embodiment being discussed as a solid disk having a face 126 and a side wall 128. Also shown are backplate face 104, lower backplate section 78 and upper backplate section 82. Referring now to FIG. 5, a perspective view of backplate 76 is shown from above in a more detailed view than the generalized, schematic view of FIG. 3. In this view, it can be seen that lower cylindrical section 78 and upper cylindrical section 82 correspond generally to FIG. 3 while intermediate frustoconical section 80 is preferably formed with a lower conical section 130 having a face 132 and an upper conical section 134 with a diameter smaller than the diameter of face 132 thereby exposing an outer face segment 136.

As shown in FIG. 5, a series of threaded adjusting shafts is shown. For the purposes of the embodiment being described herein, there are three such series of adjusting shafts with each series of shafts corresponding generally to one of shim blocks 98, 100 or 102. In FIG. 5, a first series of outer adjusting shafts 138 is shown. Each such shaft is formed with a screw thread thereon which corresponds to a tapped hole formed through outer face segment 136 thereby allowing each threads shaft 138 to be turned to move either into or out of backplate 76. To that end, each adjusting shaft 138 has a head 140 on which is formed a slot 142 to accommodate the blade of a screwdriver. It is understood that the heads of shafts 138 may be formed in any configuration that will interengage an adjusting tool such as a hexagonal head to fit a hexagonal nut driver, phillips or torx® driver blades or the like.

A second series of adjusting shafts 144 is shown with said shafts corresponding generally to intermediate shim block 108. Each said shaft 144 has a slot 146 formed thereon again representative of the various configurations possible for engaging an adjusting tool. A third series of adjusting shafts 148 is shown having head slots 150 and which correspond generally in position to central shim block 118.

Figure 6:
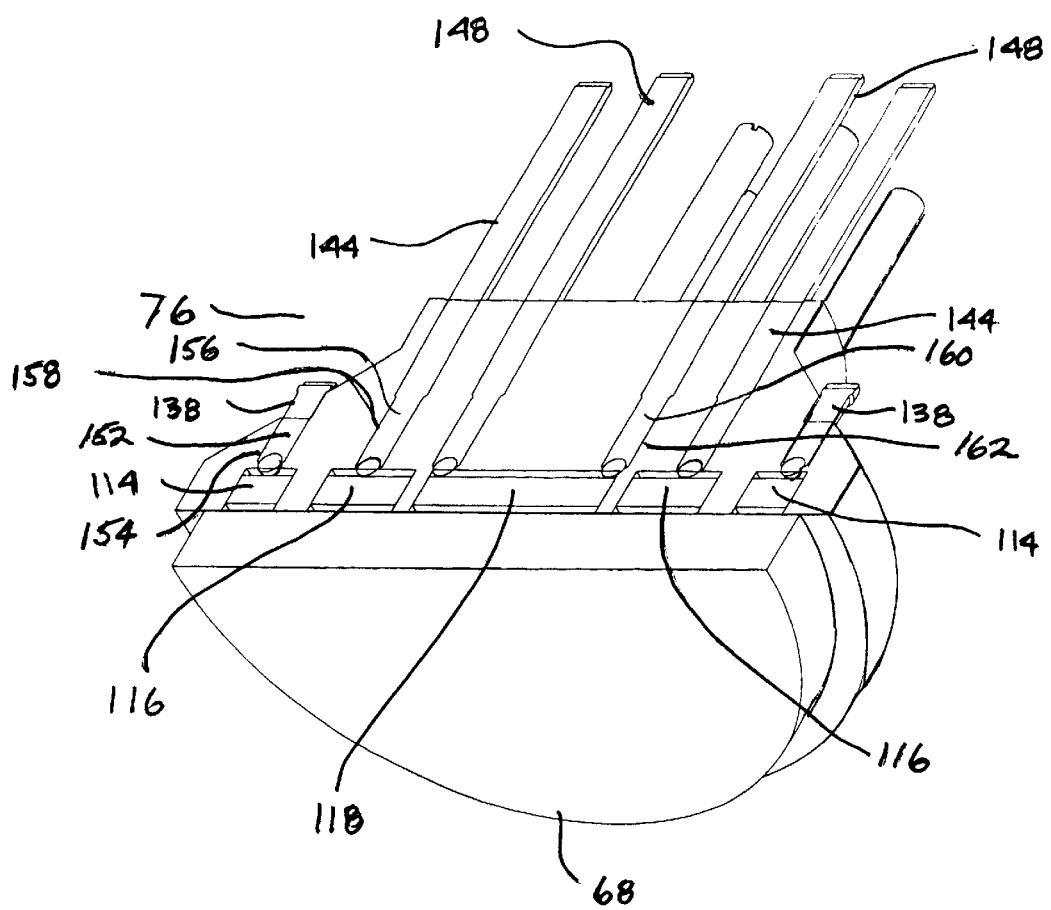
FIG. 6 is sectional view taken along 6—6 of FIG. 4 showing the individual shim blocks and adjusting screw arrangement.

Referring now to FIG. 6, a sectional view, taken in perspective shows backplate 76 and the working relationship between adjusting shafts 138 and shim block 114, adjusting shafts 144 and shim block 116 and adjusting shafts 148 and shim disk 118.

Adjusting shaft 138 has a threaded segment 152 which fits into a tapped aperture 154, with the thread pitch of segment 152 matching the inner threaded segment of aperture 154. In like fashion, the adjusting shaft 144 has a threaded segment 156 threaded into a corresponding threaded aperture 158 while each adjusting shaft 148 has a threaded segment 160 threaded into a corresponding aperture 162.

Figure 7:
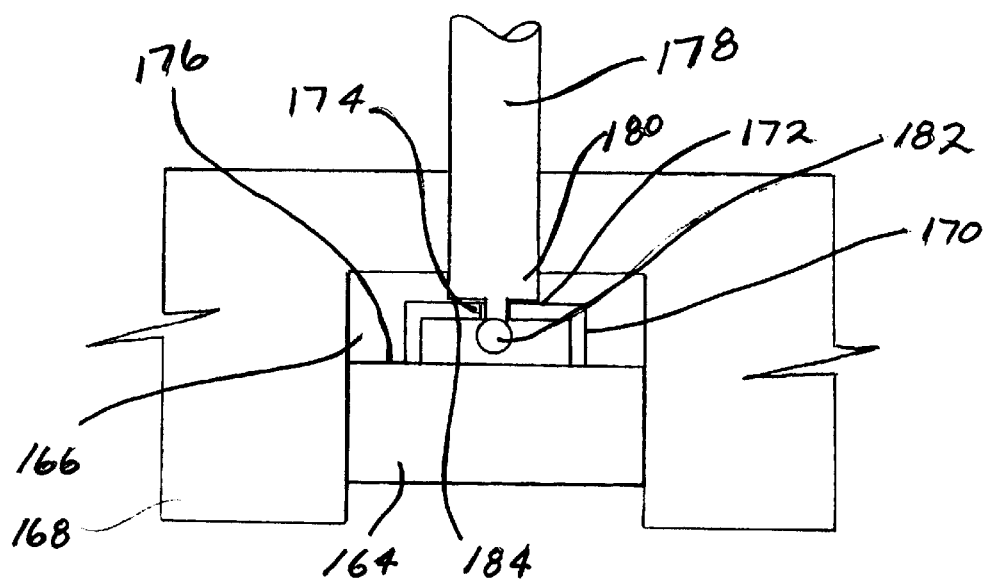
FIG. 7 is a schematic view showing the attachment of an adjusting screw to an individual shim block.

Referring now to FIG. 7, a shim block 164 is positioned within channel 166 formed in backplate 168 as described above. A U-shaped bracket 170 has a top 172 through which a bracket aperture 174 is formed as shown. Bracket 172 is attached to upper surface 176 of shim block 164.

An adjusting shaft 178 is threaded into channel 166 and has at its lowermost end a ball stop 170 attached to shaft segment 172 which, in the preferred embodiment shown is sized to fit through aperture 174. Bracket 170 is thus held between ball 182 and lowermost surface 184 of adjusting shaft 178. As adjusting shaft 178 is moved along its axis, shim block 164 is likewise moved as shaft 178 engages bracket 170.

Figure 8:
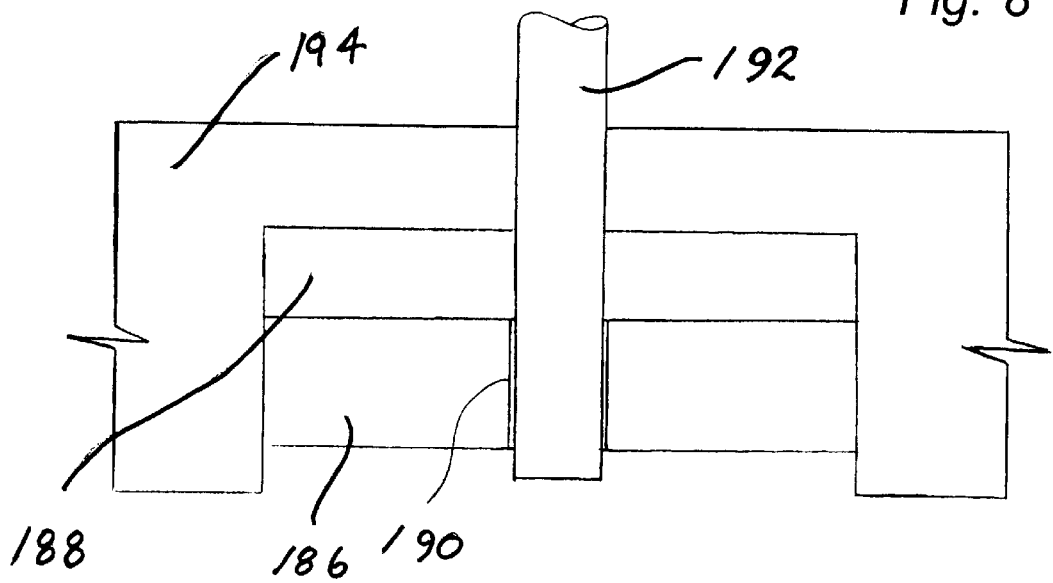
FIG. 8 is a schematic view of an adjustable slug positioned within a shim block.

Referring now to FIG. 8, a shim block 186 is shown positioned within channel 188. One or more apertures 190 are formed through shim block 186 and a ferromagnetic auxiliary adjusting shaft or slug 192, threadedly engaged with backplate 194 as described earlier may be adjusted to protrude past or withdrawn into shim block 186 to provide another field adjusting function.

Figure 9:
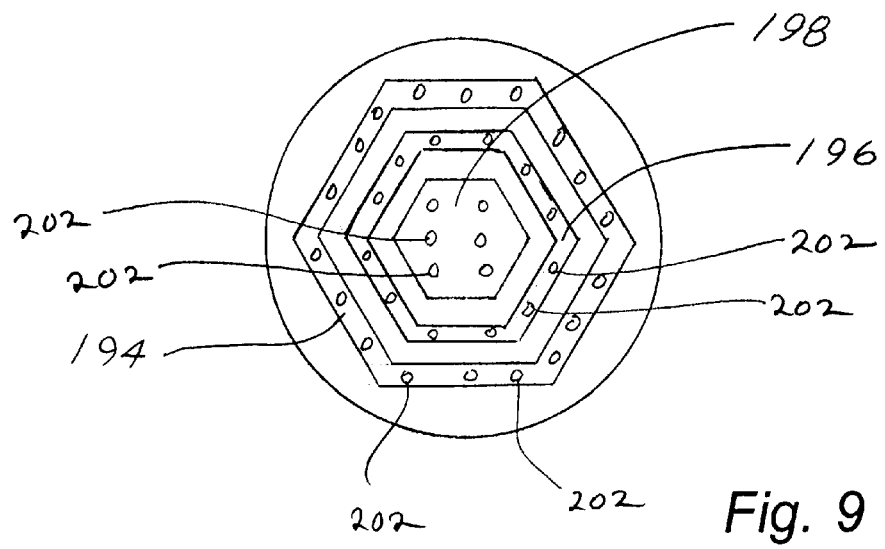
FIG. 9 is a plan view of a second preferred arrangement of shim blocks placed in the backplate.
Figure 10:
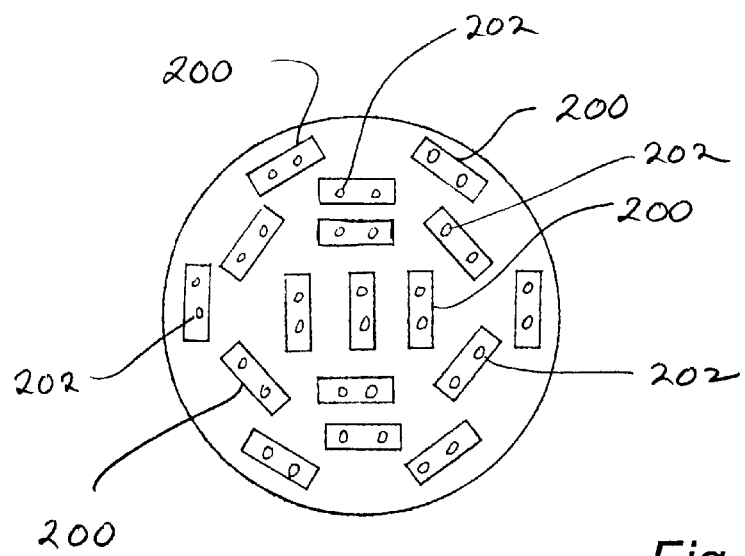
FIG. 10 is a plan view of a third preferred arrangement of shim blocks placed in the backplate.

As seen in FIGS. 9 and 10, channels of varying shapes are formed in the backplate and shims of regular polygonal shape, such as hexagons, pentagons, octagons or irregular or singular shapes are fitted within the correspondingly shaped channels. Adjusting the shims is carried out as described above.

FIG. 9 shows an outer hexagonal channel 194, an intermediate hexagonal channel 196 and a central hexagonal cavity 198 to fit shim blocks that can be made as individual segments or as solid, hexagonal "toroids" sized to fit the channels.

FIG. 10 shows a relatively random assortment of channels 200 to hold individual shim blocks. As described above, each shim block is individually adjustable by using adjusting shafts extending into the various channels or cavities via apertures 202 as shown in both FIGS. 9 and 10.

The purpose for providing such a range of combinations is to create a permanent magnet system allowing maximum opportunity and variation for adjusting the strength and uniformity of the magnetic field which extends across the air gap between the two magnet groupings. Permanent magnets used in the MRI diagnostic equipment will vary in shape, size, characteristics and magnetic idiosyncracies and providing backplates with a wide range of adjustability options will keep the MRI equipment functional without requiring remachining or replacement of expensive and difficult to manufacture magnets.

What is claimed is:

1. A permanent magnet structure, comprising:

first and second permanent magnet groupings;

a generally C-shaped yoke holding said magnet groupings in fixed, substantially parallel spatial relationship;

an air gap defined by the spacing apart of said magnet groupings;

each said magnet grouping having a front and a rear, with each said grouping front facing toward said air gap;

a magnetic field formed from said first grouping front to said second grouping front across said air gap;

first and second backing plates, each said backing plate supporting one said magnet grouping and securing said magnet grouping to said yoke; and first means for adjusting said magnetic field, second means for adjusting said magnetic field, said first adjusting means comprising a series of ferromagnetic shim blocks individually adjustably positionable with respect to said first magnet grouping, and said second adjusting means comprising a series of ferromagnetic shim blocks individually adjustably positionable with respect to said second magnet grouping, each said adjusting means having a series of axially adjustable support shafts threadably attached to one said backing plate, each said shaft attached to one said shim block whereby said shim block is adjusted to move with respect to one said magnet grouping when said shaft is threaded in said backing plate, at least one said shim block having a threaded aperture formed therethrough to engage one said shaft whereby said shaft is adjustable within said shim block, said shaft being formed from a magnetic material.

2. The apparatus as recited in claim 1 wherein said backing plate includes at least one channel formed therein, and at least one said shim block is formed as a toroidal member sized and shaped to fit into said channel.

3. The apparatus as recited in claim 2 wherein said channel and said toroidal member are of identical geometric shapes.

4. The apparatus as recited in claim 3 wherein said channel and said toroidal member are circular.

5. The apparatus as recited in claim 3 wherein said channel and said toroidal member are hexagonal.

* * * * *